(12) United States Patent
Lu et al.

(10) Patent No.: US 6,175,519 B1
(45) Date of Patent: Jan. 16, 2001

(54) VIRTUAL GROUND EPROM STRUCTURE

(75) Inventors: Tao Cheng Lu, Kaohsiung; Mam Tsung Wang, Hsinchu; Chin Hsi Lin; Ful Long Ni, both of Hsinchu, all of (TW)

(73) Assignee: Macronix International Co., Ltd., Hsinchu (TW)

( * ) Notice: Under 35 U.S.C. 154(b), the term of this patent shall be extended for 0 days.

(21) Appl. No.: 09/359,197

(22) Filed: Jul. 22, 1999

(51) Int. Cl.$^7$ .................................................. G11C 16/06
(52) U.S. Cl. ............................ 365/185.02; 365/185.16; 365/185.22
(58) Field of Search ..................... 365/185.02, 185.16, 365/185.11, 185.05, 185.22

(56) References Cited

U.S. PATENT DOCUMENTS

| | | | |
|---|---|---|---|
| 5,202,848 | 4/1993 | Nakagawara | 365/104 |
| 5,241,497 * | 8/1993 | Komarek | 365/104 |
| 5,463,586 | 10/1995 | Chao et al. | 365/210 |
| 5,553,020 | 9/1996 | Keeney et al. | 365/185.19 |
| 5,563,822 | 10/1996 | Yiu et al. | 365/185.14 |
| 5,590,076 | 12/1996 | Haddad et al. | 365/185.25 |
| 5,677,216 | 10/1997 | Tseng | 437/43 |
| 5,734,602 * | 3/1998 | Guritz et al. | 365/104 |
| 5,959,892 * | 9/1999 | Lin et al. | 365/185.28 |
| 6,064,592 * | 5/2000 | Nakagawa et al. | 365/185.05 |

* cited by examiner

*Primary Examiner*—Richard Elms
*Assistant Examiner*—Hien Nguyen
(74) *Attorney, Agent, or Firm*—Beyer Weaver & Thomas, LLP

(57) ABSTRACT

In a virtual ground semiconductor memory device such as an EPROM or a Flash EPROM, a program disturb inhibited unit is operatively connected to a memory array. The memory array includes a plurality of metal virtual ground and bit lines, with at least two bit line selection transistors connected to each of the metal lines. The program disturb inhibited is connected to each virtual ground line and each bit line. In this structure, one metal pitch is connected to two buried diffusion lines. The program inhibited unit includes a plurality of program disturb inhibited transistors, wherein each transistor is connected between a virtual ground and a bit line. A DWL and a DWR dummy line are connected to control the plurality of program disturb inhibited transistors. By combining the program disturb inhibit unit with the memory array, a conventional array structure which has only been suitable for MROM applications can be applied to an EPROM or a Flash EEPROM, allowing the cell size to be reduced.

20 Claims, 4 Drawing Sheets

VIRTUAL GROUND EPROM STRUCTURE

CROSS-REFERENCE TO RELATED APPLICATION

This application is related to U.S. patent application, entitled "METHOD FOR FAST PROGRAMMING OF EPROMS AND MULTI-LEVEL FLASH EPROMS" filed concurrently herewith on Jul. 22, 1999, U.S. patent application Ser. No. 09/359,073 and to U.S. patent application Ser. No. 08/918,796, entitled "APPARATUS AND METHOD FOR PROGRAMMING VIRTUAL GROUND EPROM ARRAY CELL WITHOUT DISTURBING ADJACENT CELLS" filed Aug. 26, 1997, now a U.S. Pat. No. 5,959,892 both applications being assigned to the assignee of the present invention, and herein incorporated by reference.

BACKGROUND OF THE INVENTION

1. Field of the Invention

The present invention relates generally to semiconductor memory devices and, more particularly, to an improved virtual ground structure for erasable programmable read-only memory devices (EPROMS).

2. Description of the Related Art

Erasable programmable read only memory (EPROM), electronically erasable programmable read only memory (EEPROM) and Flash memory are classes of floating gate memory devices. More particularly, these floating gate memory devices are programmable memory devices which use floating gates as charge storage layers. These devices are based on a memory transistor, consisting of a source, channel, and a drain with a floating gate over the channel and a control gate isolated from the floating gate. Programming a cell requires charging the floating gate with electrons, which increases the turn on threshold of the memory cell. Flash EPROMS typically use a "hot electron" programming technique to charge the cells. When programmed, the cell will not turn on, i.e. it remains non-conductive, if a read potential is applied to its control gate. To erase the cell, electrons are removed from the floating gate in order to lower the threshold. With a lower threshold, the cell will now turn on when a read potential is applied to the control gate. Conventionally, hot electron programming is performed by ramping up the drain voltage or the gate voltage. In other words, the source voltage is first shorted to ground, and then the drain (or gate) voltage is increased. Finally, the gate (or drain) voltage is applied.

One known type of EPROM structure is a virtual ground structure. For a conventional virtual ground structure 10 shown in FIG. 1, as disclosed in U.S. patent application Ser. No. 08/918,796 entitled "APPARATUS AND METHOD FOR PROGRAMMING VIRTUAL GROUND EPROM ARRAY CELL WITHOUT DISTURBING ADJACENT CELLS," shrinking the cell size does not result in a reduction in array size because the metal pitch is the dominant factor. The principal reason is that the buried bit lines and ground lines are formed by an N+diffusion and are connected to individual metal lines. However, the metal line widths and spacing are difficult to shrink due to yield considerations (i.e. further reductions in line widths or spacing would lower the yield to unacceptable levels).

FIG. 2 illustrates a prior art cell for a mask programmable read-only memory (MROM) application, as disclosed in U.S. Pat. No. 5,202,848. By combining one metal line with two bit line selection transistors (BLT), also known as band select transistors, the cell size can keep shrinking because the metal pitch is no longer the dominant limiting factor. For this structure, one metal pitch is connected to two buried diffusion lines. However, if a similar structure is applied to EPROMS, the device would suffer from programming disturbances for the adjacent cells. For example, if a high voltage is applied to bitline 1 when cell 1 is programmed, cell 2 will also experience a high voltage causing a possible disturbance to the data in cell 2.

Therefore, it would be desirable to have an improved EPROM structure whose cell size can shrink independent of the metal pitch and which does not produce programming disturbances on adjacent cells.

SUMMARY OF THE INVENTION

In a virtual ground semiconductor memory device such as an EPROM or a Flash EPROM, a program disturb inhibited unit is operatively connected to a memory array. The memory array comprises a plurality of rows of memory cells, with each cell in a row connected to a common cell word line (SWL). The memory array further includes a plurality of metal virtual ground and bit lines, with at least two bit line selection transistors (BLT) connected to each of the metal lines.

The program disturb inhibited connects to each virtual ground line and each bit line. In this structure, one metal pitch is connected to two buried diffusion lines. In a preferred embodiment, four block selection lines (BWL) lines are connected to control the bit line selection transistors. The program inhibited unit includes a plurality of program disturb inhibited transistors, wherein each transistor is connected between a virtual ground and a bit line. A DWL and a DWR dummy line are connected to control the plurality of program disturb inhibited transistors. The bit line transistors or the program disturb inhibited transistors may be either buried type transistors or normal peripheral transistors.

In order to perform a programming operation, the program pulses are divided into a program disturbance inhibited period and a programming period. The program disturbance inhibited unit prevents adjacent memory cells from being disturbed by a programming operation on an adjacent cell.

By combining the program disturb inhibit unit with the memory array, the conventional array structure which has only been suitable for MROM applications can be applied to an EPROM or a Flash EEPROM, thus allowing the cell size to be reduced.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide a novel virtual ground EPROM structure.

Figure 1:
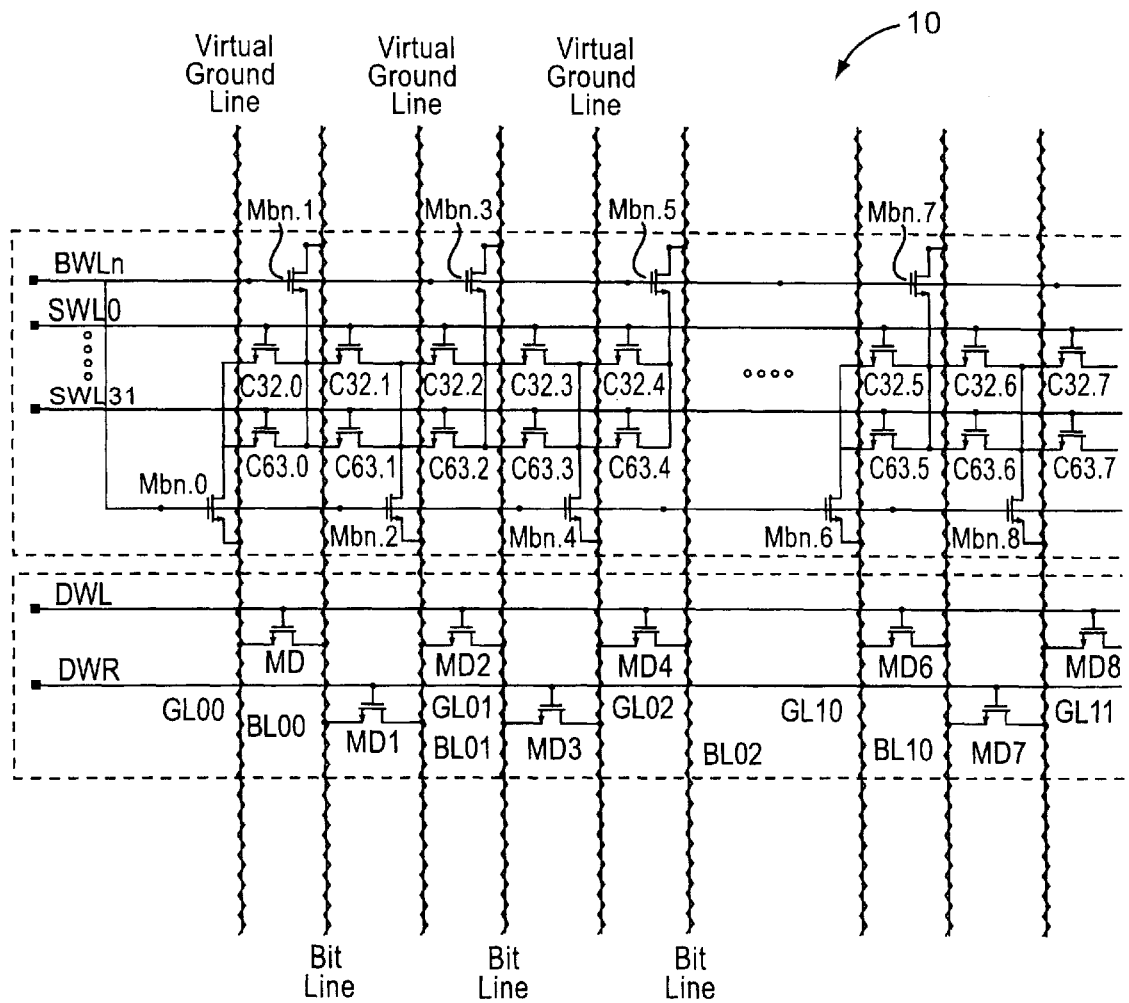
FIG. 1 is a schematic diagram of a prior art virtual ground EPROM structure.
Figure 2:
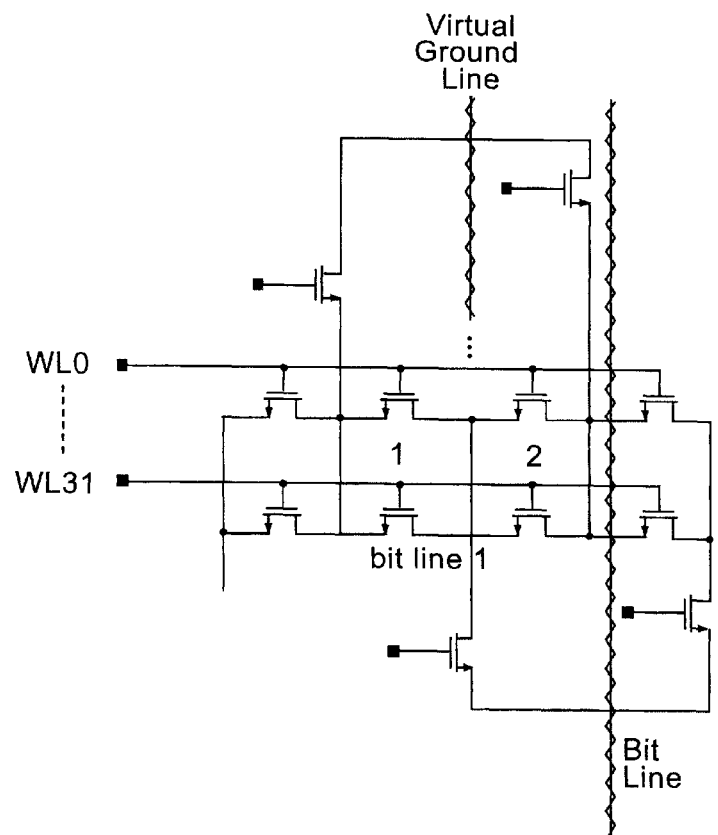
FIG. 2 is a schematic diagram of a prior art MROM.
Figure 3:
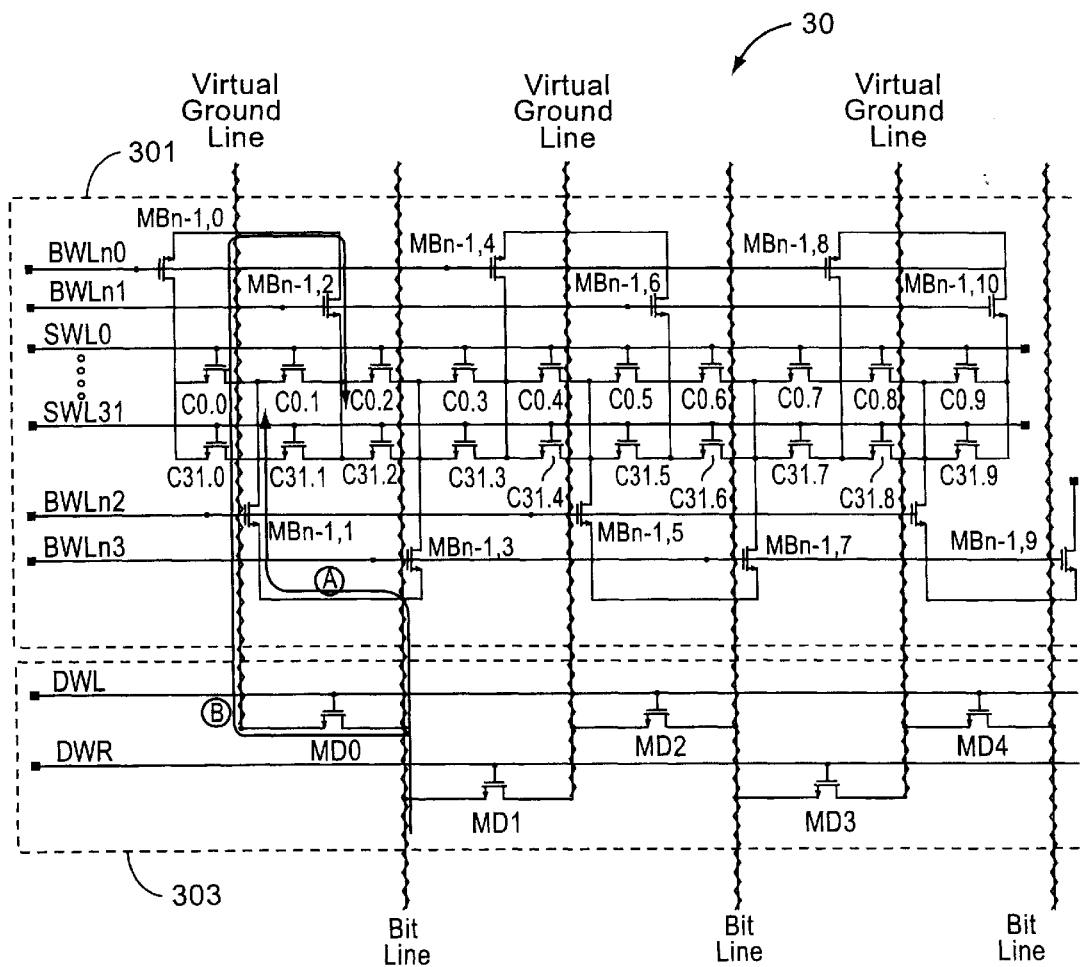
FIG. 3 is a schematic diagram of a virtual ground EPROM according to the present invention.

A virtual ground EPROM structure 30 according to the present invention is illustrated in FIG. 3. The structure 30 includes a program disturb inhibited unit 303 comprising disturbance inhibited transistors MD0–MD4 that are controlled by dummy word lines DWR and DWL. The program disturb inhibited unit 303 is operatively connected to a memory array 301. The memory array 301 comprises a plurality of floating gate memory cells C0,0–C31,9, each cell connected to a cell word line SWL0–SWL31. The floating gate memory cells are coupled source to drain to form the rows of memory cells. The control gates of the memory cells are coupled to the same wordline. Two bit line selection transistors (BLTs) (i.e. MBn-1,0 and MBn1,2) are connected to each metal line (ground or bit line), which allows the cell size to be reduced. The virtual ground lines are connected to the sources of the BLTs, whereas the bit lines are connected to the drains of the BLTs. Four block selection lines (BWL) BWLn0–BWLn3 control the bit line selection transistors MBn-1,0–MBn-1,9. Notice that the prior art structure of FIG. 1 has only one BWL control line. Also, in the present structure 30, one metal pitch is connected to two buried diffusion lines. This structure 30 can prevent programming disturbances on adjacent cells, as described below.

For a read operation, DWR and DWL are low and the program disturb inhibited unit 303 is turned off. The BWL decoding method is listed below:

| Cell | BWLn0 | BWLn1 | BWLn2 | BWLn3 |
|------|-------|-------|-------|-------|
| C0.0 | on    | off   | on    | off   |
| C0.1 | off   | on    | on    | off   |
| C0.2 | off   | on    | off   | on    |
| C0.3 | on    | off   | off   | on    |

Figure 4:
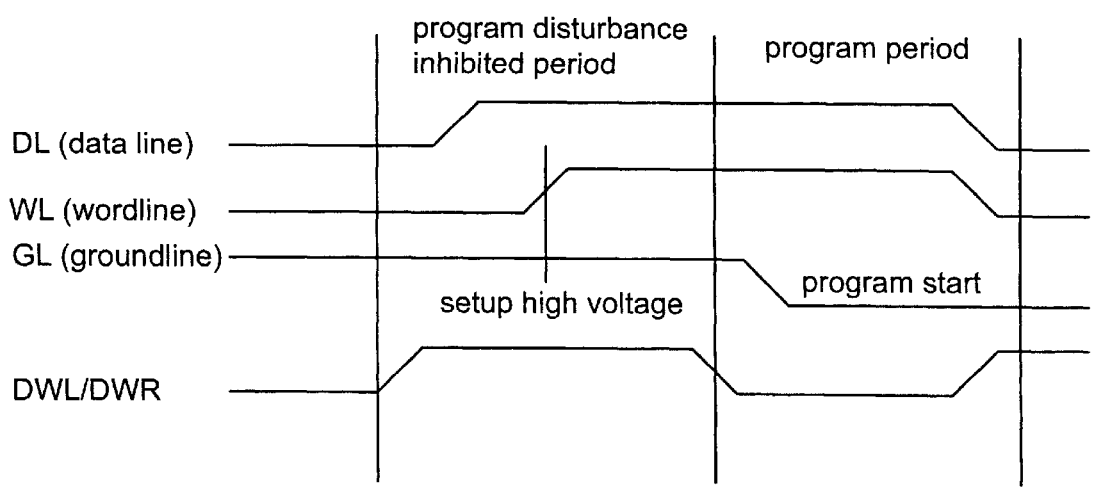
FIG. 4 is a timing diagram of the program timing of the virtual ground EPROM constructed according to the present invention.

In order to perform a programming operation, the program pulses are divided into a program disturbance inhibited period and a programming period as shown in FIG. 4. During a program disturbance inhibited period, the ground line GL is first pulled high, then the data line DL (i.e. a bit line in FIG. 3) is pulled up, and finally the word line voltage is pulled up. Under these conditions, the data line DL and the ground line GL are kept at a high voltage to inhibit programming during this period. In addition, the corresponding BWL and DWL/DWR lines are turned on to prevent any voltages from disturbing the adjacent cells during the following programming period. During the programming period, the ground line GL is pulled down and the corresponding BWL line is turned on to generate a high electric field between the drain and the source of the programmed cell, in order to perform hot electron programming.

The corresponding BWL and DWL/DWR decoding scheme during the program disturbance inhibited period is listed below:

| Cell | BWLn0 | BWLn1 | BWLn2 | BWLn3 | DWL | DWR |
|------|-------|-------|-------|-------|-----|-----|
| C0.0 | off   | on    | on    | off   | on  | off |
| C0.1 | on    | off   | on    | off   | on  | off |
| C0.2 | on    | off   | off   | on    | off | on  |
| C0.3 | off   | on    | off   | on    | on  | off |

For example, in order to program cell C0,0 without disturbing C0,1,the drain sides of C0,0 and C0,1 are charged to a high voltage through path A by turning on BWLn2. However, the source side of C0,1 is charged to a high voltage through path B by turning on the DWL and BLWn1 lines. Therefore, the cell C0,1 will not be disturbed during the programming period.

The programming period is performed after the program disturbance inhibited period by pulling down source side of C0,0. During the programming period, the DWR and DWL lines are low and the BWL decoding scheme is the same as the read operation and is listed below:

| Cell | BWLn0 | BWLn1 | BWLn2 | BWLn3 |
|------|-------|-------|-------|-------|
| C0.0 | on    | off   | on    | off   |
| C0.1 | off   | on    | on    | off   |
| C0.2 | off   | on    | off   | on    |
| C0.3 | on    | off   | off   | on    |

Figure 5:
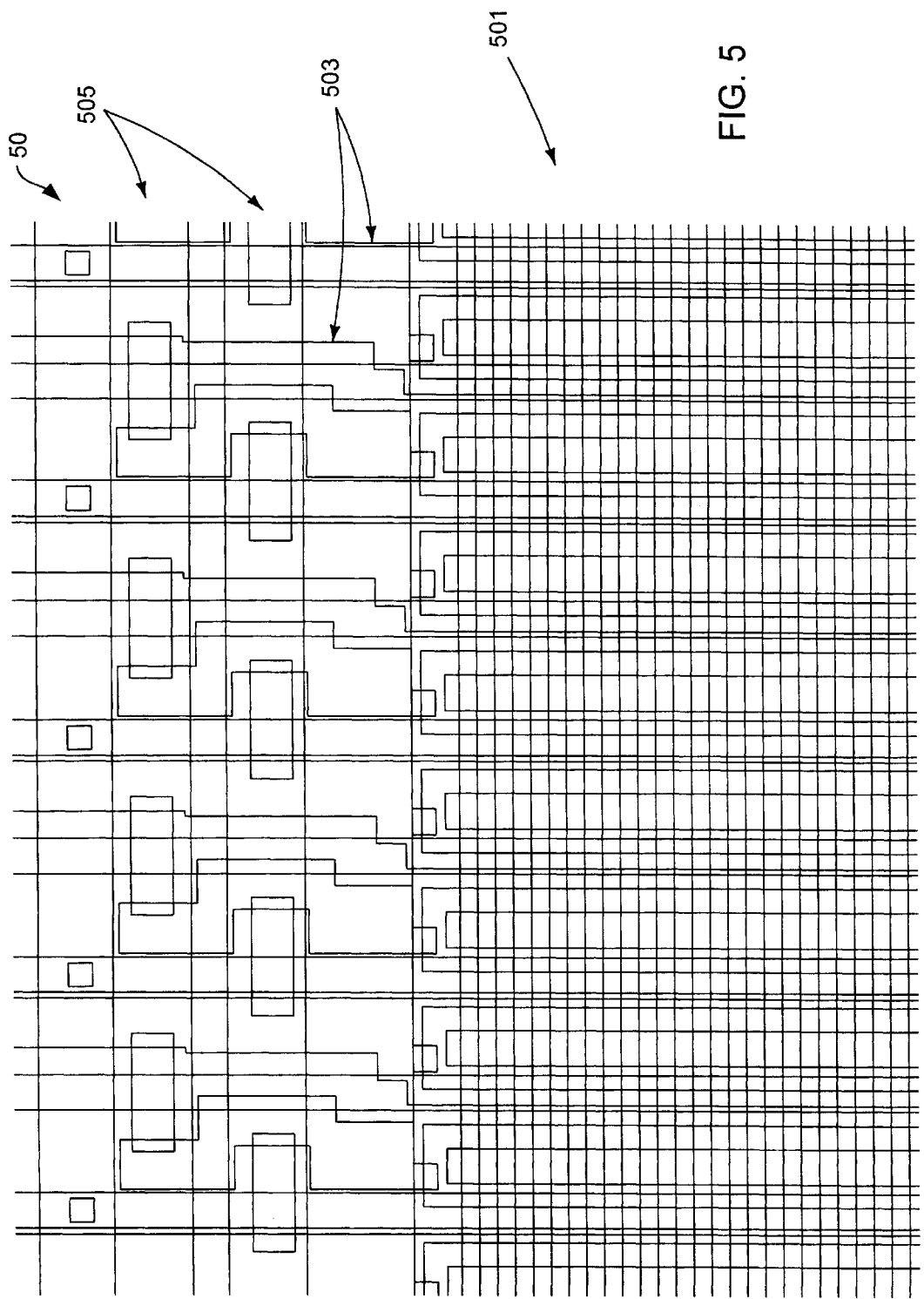
FIG. 5 is a layout diagram showing the band selected transistors and memory cells according to one embodiment of the present invention.

The virtual ground EPROM structure of the present invention is shown in FIG. 3. The key process for manufacturing the structure include:

a. define N/P well region
b. define active/isolation region
c. Vt implantation and tunnel oxide growth of cell region
d. form the channel region of memory array by poly 1 mask (poly 1 is the floating gate)
e. form the buried source or buried drain diffusions for the memory array by self-aligning implant from poly 1
f form poly 4 to increase GCR of memory cells by increasing area of floating gate
g. ONO formation and patterning
h. Vt implantation and gate oxide growth of peripheral MOS transistors
i. poly 2 deposition and patterning for control gate of memory cell and poly gate of peripheral MOS transistors
J. source/drain region formation of peripheral MOS transistors Based on the above process, the transistors can be distinguished as two different types. The first type is the buried type transistors, such as the memory cells in which the drain and source are formed by buried diffusions. The other type is the normal transistors, such as peripheral N/PMOS transistors. The new virtual ground EPROM structure shown in FIG. 3 contains memory cells C0,0–C31,9, bit line selection transistors (BLT) MBn-1,0–MBn-1, A and the program disturb inhibited transistors MD0–MD4. Because the BLT transistors MBn-1,0–MBn-1,A and the program disturb inhibited transistors MD0–MD4 are near the memory array, they can be either buried type transistors or normal peripheral transistors. For example, FIG. 5 shows the layout 50 of the BLT transistors 505 and memory cells 501, with the buried diffusion 503. The BLT transistors 505 in FIG. 5 are formed by buried type diffusion. The main point is that the BLT transistors 505 or the program disturb inhibited transistors MD0–MD4 can be either buried type transistors or normal peripheral transistors.

Thus, by combining a program disturb inhibit unit 303 with a memory array 301, the conventional array structure which has only been suitable for MROM applications can be applied to an EPROM or a Flash EEPROM, allowing the cell size to be reduced. Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A semiconductor memory device comprising:
   a memory array having a plurality of floating gate memory cells;
   metal lines connected to the memory array;
   at least two bit line selection transistors connected to each metal line; and
   a program disturb inhibited unit operatively connected to the memory array.

2. The memory device of claim 1, wherein the metal lines include virtual ground lines.

3. The memory device of claim 2, wherein the metal lines include bit lines.

4. The memory device of claim 3, further comprising at least four block selection lines (BWL) for controlling the bit line selection transistors.

5. The memory device of claim 4, wherein one metal pitch is connected to two buried diffusion lines.

6. The memory device of claim 5, wherein the program disturb inhibited unit comprises at least two dummy word lines.

7. The memory device of claim 6, wherein the two bit line selection transistors connected to a virtual ground line are connected via a source terminal.

8. The memory device of claim 7, wherein the two bit line selection transistors connected to a bit line are connected via a drain terminal.

9. The memory device of claim 8, wherein the bit line transistors are either buried type transistors or normal peripheral transistors.

10. The memory device of claim 9 wherein the program disturb inhibited transistors are either buried type transistors or normal peripheral transistors.

11. The memory device of claim 10, wherein the memory device is an erasable programmable read-only memory (EPROM).

12. The memory device of claim 10, wherein the memory device is a Flash erasable programmable read-only memory (Flash EPROM).

13. A virtual ground erasable programmable read-only memory structure comprising:
    a memory array comprising:
      a plurality of rows of floating gate memory cells, each cell in a row connected to a common cell word line (SWL);
      a plurality of virtual ground lines;
      a plurality of bit lines;
      at least two bit line selection transistors connected to each virtual ground line and each bit line;
      at least two block selection lines (BWL) connected to each virtual ground line;
      at least two block selection lines (BWL) connected to each bit line; and
    a program disturb inhibited unit comprising:
      a plurality of program disturb inhibited transistors, wherein each transistor is connected between a virtual ground and a bit line; and
      at least two dummy word lines (DWL, DWR) connected to control the plurality of program disturb inhibited transistors.

14. The structure of claim 13, wherein one metal pitch is connected to two buried diffusion lines.

15. The structure of claim 14, wherein the two bit line selection transistors connected to a virtual ground line are connected via a source terminal.

16. The structure of claim 15, wherein the two bit line selection transistors connected to a bit line are connected via a drain terminal.

17. The structure of claim 16, wherein the bit line selection transistors or the program disturb inhibited transistors are either buried type transistors or normal peripheral transistors.

18. The structure of claim 17, wherein the erasable programmable read-only memory is a Flash EPROM.

19. A virtual ground EPROM structure, comprising:
    a memory array;
    a plurality of bit line selection transistors;
    a plurality of metal lines, wherein each of the plurality of metal lines is connected to at least two bit line selection transistors of the plurality of two bit line selection transistors; and
    a program disturb inhibited unit operatively connected to the memory array.

20. The virtual ground EMPROM structure of claim 19, wherein one metal pitch is connected to two buried diffusion lines.

* * * * *